United States Patent
Takahashi

(10) Patent No.: US 7,420,266 B2
(45) Date of Patent: Sep. 2, 2008

(54) CIRCUIT DEVICE AND MANUFACTURING METHOD THEREOF

(75) Inventor: Kouji Takahashi, Gunma (JP)

(73) Assignee: Sanyo Electric Co., Ltd.

( * ) Notice: Subject to any disclaimer, the term of this patent is extended or adjusted under 35 U.S.C. 154(b) by 162 days.

(21) Appl. No.: 10/953,299

(22) Filed: Sep. 29, 2004

(65) Prior Publication Data

US 2005/0104198 A1   May 19, 2005

(30) Foreign Application Priority Data

Sep. 30, 2003   (JP)   .......................... P. 2003-342082
Aug. 31, 2004   (JP)   .......................... P. 2004-251364

(51) Int. Cl.
*H01L 23/495*   (2006.01)
*H01L 23/28*   (2006.01)
*H01L 29/40*   (2006.01)

(52) U.S. Cl. .................... 257/669; 257/676; 257/784; 257/787

(58) Field of Classification Search .................. 257/669, 257/676, 666, 784, 787, 686
See application file for complete search history.

(56) References Cited

U.S. PATENT DOCUMENTS

| 5,637,922 | A | 6/1997 | Fillion et al. |
| 6,548,328 | B1* | 4/2003 | Sakamoto et al. ............ 438/121 |
| 6,562,660 | B1* | 5/2003 | Sakamoto et al. ............ 438/124 |
| 6,706,547 | B2* | 3/2004 | Sakamoto et al. ............. 438/33 |
| 6,946,724 | B2* | 9/2005 | Igarashi et al. .............. 257/669 |
| 6,955,942 | B2* | 10/2005 | Kobayashi et al. .......... 438/106 |
| 2003/0111707 | A1* | 6/2003 | Takaura et al. .............. 257/510 |

FOREIGN PATENT DOCUMENTS

JP       2002-76246       3/2002

* cited by examiner

*Primary Examiner*—Howard Weiss
*Assistant Examiner*—Steven H Rao
(74) *Attorney, Agent, or Firm*—Fish & Richardson P.C.

(57) ABSTRACT

Provided is a circuit device having conductive patterns which are equally spaced apart and a manufacturing method thereof. A method for manufacturing a circuit device of the present invention includes the steps of: preparing a conductive foil; forming conductive patterns, which are included in a unit having at least regions for mounting circuit elements, by forming isolation trenches having a uniform width in the conductive foil; electrically connecting the conductive patterns to the circuit elements; sealing with a sealing resin so as to cover the circuit elements and to be filled in the isolation trenches; and removing the conductive foil in its thickness portions where no isolation trenches are provided.

13 Claims, 9 Drawing Sheets

Width of the isolation trench: W ($\mu$m)

CIRCUIT DEVICE AND MANUFACTURING METHOD THEREOF

BACKGROUND OF THE INVENTION

Priority is claimed to Japanese Patent Application Numbers JP2003-342082, filed on Sep. 30, 2003, and JP2004-251364, filed on Aug. 31, 2004, the disclosures of which are incorporated herein by reference in its entireties.

1. Field of the Invention

The present invention relates to a circuit device and a manufacturing method thereof, more particularly to a circuit device having conductive patterns which are equally spaced apart and a manufacturing method thereof.

2. Description of the Related Art

Conventionally, circuit devices set in electronic equipment have been required to be made smaller, thinner and lighter since the circuit devices are adopted in portable telephones, portable computers and the like.

For example, as the circuit device, a semiconductor device will be described as an example. A wafer-scale CSP having the same size as a chip, which is called a CSP (chip size package), has been recently developed.

FIG. 11 shows a CSP 66 which is slightly larger than chip size. In the CSP 66, a glass epoxy board 65 is adopted as a supporting board. Here, the CSP 66 will be described assuming that a transistor chip T is mounted on the glass epoxy board 65.

On a surface of this glass epoxy board 65, a first electrode 67, a second electrode 68 and a die pad 69 are formed. On a back of the glass epoxy board 65, a first back electrode 70 and a second back electrode 71 are formed. Accordingly, through a through hole TH, the first electrode 67 and the first back electrode 70 are connected to each other. Furthermore, through a through hole TH, the second electrode 68 and the second back electrode 71 are electrically connected to each other. Moreover, the bare transistor chip T is die bonded to the die pad 69 and an emitter electrode of the transistor and the first electrode 67 are connected to each other through a thin metal wire 72. Furthermore, a base electrode of the transistor and the second electrode 68 are connected to each other through a thin metal wire 72. A resin layer 73 is provided on the glass epoxy board 65 so as to cover the transistor chip T.

In the CSP 66, the glass epoxy board 65 is adopted, which leads to an advantage that, unlike the wafer-scale CSP, an extension structure from the chip T to the back electrodes 70 and 71 for external connection can be easily formed and the CSP 66 is manufactured at low cost.

However, in the CSP 66 described above, the glass epoxy board 65 is used as an interposer. Thus, miniaturization and thinning of the CSP 66 had limitations. Consequently, a circuit device 80 requiring no package board, as shown in FIG. 12, was developed (for example, see patent document 1).

With reference to FIG. 12, in the circuit device 80, a circuit element 82 is die bonded to a conductive pattern 81. The circuit element 82 and the conductive pattern 81 are connected to each other through a thin metal wiring 84. A sealing resin 83 covers the circuit element 82, the thin metal wiring 84 and the conductive pattern 81 while exposing a back of the conductive pattern 81. Therefore, the circuit device 80 is configured to require no package board and is formed to be thinner and smaller than the CSP 66.

The conductive pattern 81 in the circuit device 80 is formed by etching a conductive foil. To be more specific, first, a surface of the conductive foil is half etched to form an isolation trench 87. By forming the isolation trench 87, a convex conductive pattern 81 is formed in the surface of the conductive foil. Next, the circuit element 82 is electrically connected to the conductive pattern 81. Thereafter, the sealing resin 83 is formed so as to cover the circuit element and to be filled in the isolation trench 87. Furthermore, the conductive foil is removed from its back until the sealing resin 83 filled in the isolation trench 87 is exposed. Thus, respective conductive patterns 81 are separated. By performing the steps described above, the conductive patterns 81 having a desired shape are formed.

[Patent Document 1]

Japanese Patent Laid-Open No. 2002-076246 (Page 7, FIG. 1)

SUMMARY OF THE INVENTION

However, when a width of the isolation trench 87 is narrowed in order to allow the conductive patterns 81 to come close to each other, there was a problem that a depth of the isolation trench 87 becomes nonuniform. For example, when the width of the isolation trench 87 is set to about 150 µm or less, the depth of the isolation trench 87 becomes nonuniform. As described above, the respective conductive patterns 81 are separated by etching the conductive foil from its back surface until the sealing resin 83 filled in the isolation trench 87 is exposed. If a locally shallow isolation trench 87 is formed, the conductive foil is etched from its back surface until the sealing resin 83 filled in this shallow isolation trench 87 is exposed. Therefore, by performing excessive etching, the conductive patterns 81 are thinly formed. Thus, there was a problem that a current capacity of the conductive patterns 81 is reduced.

Moreover, when a space between the conductive patterns 81 becomes nonuniform, there was a problem that large parasitic capacitances arose locally. Therefore, it was required to consider locally different parasitic capacitances in performing a circuit design. This complicated the circuit design. The present invention was made in consideration for the foregoing problems. In the embodiment of the present invention, a circuit device having equally spaced-apart conductive patterns and a manufacturing method thereof are provided.

A circuit device of the present invention includes: conductive patterns; and circuit elements electrically connected to the conductive patterns. In the circuit device, the conductive patterns are equally spaced apart.

Furthermore, a circuit device of the present invention includes: conductive patterns separated by isolation trenches; circuit elements electrically connected to the conductive patterns; and a sealing resin covering the conductive patterns and the circuit elements while exposing back sides of the conductive patterns. In the circuit device, the conductive patterns are equally separated by the isolation trenches.

A method for manufacturing a circuit device of the present invention includes: preparing a conductive foil; forming convex conductive patterns by forming isolation trenches having a uniform width in the conductive foil; electrically connecting the conductive patterns to circuit elements; sealing with a sealing resin so as to cover the circuit elements and to be filled in the isolation trenches; and removing a back of the conductive foil until the sealing resin filled in the isolation trenches is exposed.

Furthermore, a method for manufacturing a circuit device of the present invention includes: preparing a conductive foil; forming convex conductive patterns included in a unit by forming first isolation trenches having a uniform width in the conductive foil and providing second isolation trenches having a width larger than that of the first isolation trenches between the units; electrically connecting the conductive patterns to circuit elements; sealing with a sealing resin so as to cover the circuit elements and to be filled in the first and the second isolation trenches; removing a back of the conductive foil until the sealing resin filled in the first and the second isolation trenches is exposed; and separating the units by cutting the sealing resin filled in the second isolation trench.

Furthermore, a circuit device comprising: conductive patterns isolated from each other by isolation trenches formed by etching; a circuit element electrically connected to the conductive patterns; and a sealing resin covering the circuit elements and the conductive patterns while exposing back sides of the conductive patterns, wherein a width of the isolation trench is made to be not less than a length at which a depth of the trench formed by etching is saturated.

Furthermore, a method for manufacturing a circuit device, comprising: allowing conductive patterns to be formed to protrude convexly on a surface of a conductive foil by forming isolation trenches shallower than a thickness of the conductive foil by etching; electrically connecting a circuit element to the conductive patterns; forming a sealing resin so as to be filled in the isolation trenches and to cover the circuit elements; and removing a back surface of the conductive foil until the sealing resin filled in the isolation trenches is exposed, wherein a width of the isolation trench is made to be not less than a length at which a depth of the trench formed by etching is saturated.

According to the circuit device of the present invention, a space between the conductive patterns is fixed. Thus, values of parasitic capacitances arising between the conductive patterns and the sealing resin can be easily predicted. Therefore, designing of a circuit pattern considering the parasitic capacitances is facilitated.

According to the method for manufacturing a circuit device of the present invention, the isolation trench is formed to have a uniform width. Thus, the isolation trench formed by etching also has a uniform depth. Therefore, the conductive patterns can be equally spaced apart. Furthermore, by forming the isolation trench to have a certain width or more, a variation in depth of the trench can be suppressed and a high-quality circuit device can be manufactured. Since the depth of the isolation trench is made uniform, conductive patterns having a desired thickness can be formed.

DESCRIPTION OF THE EMBODIMENTS

Figure 1A:
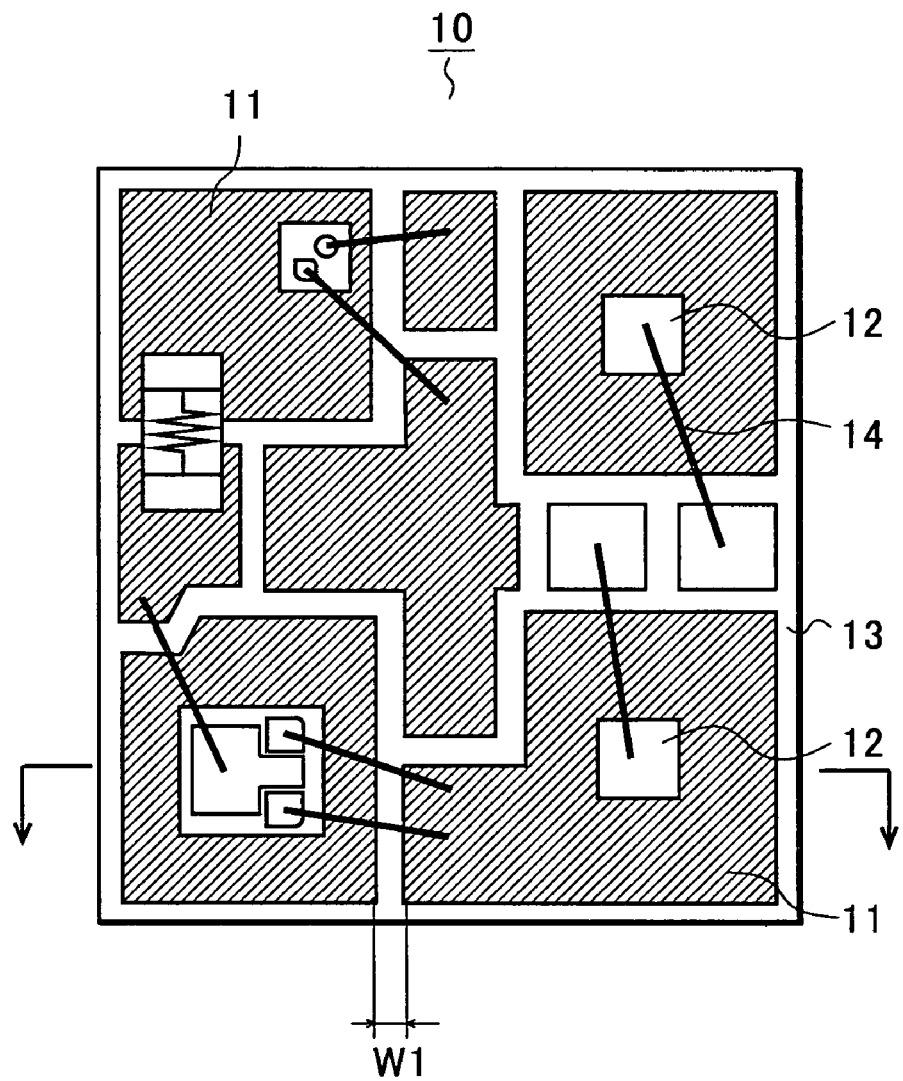
FIGS. 1A and 1B are a plan view (A) and a cross-sectional view (B) showing a circuit device according to an embodiment of the present invention.
Figure 1B:
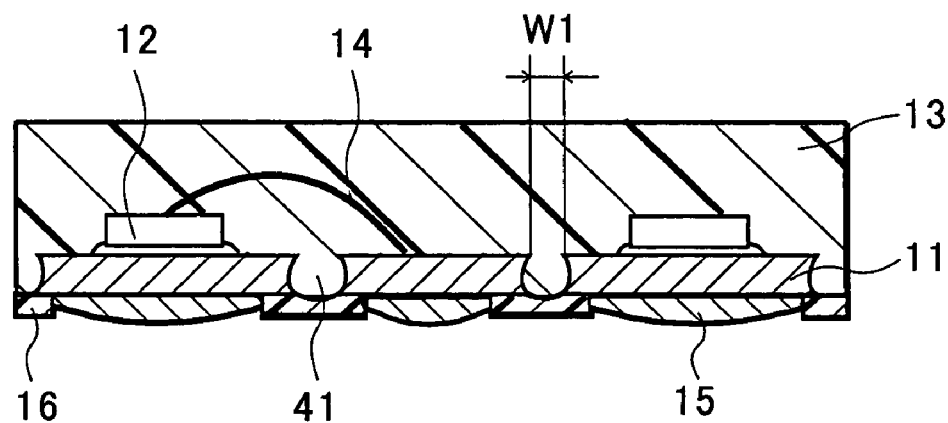

With reference to FIGS. 1A and 1B, description will be given of a configuration of a circuit device 10 of this embodiment. FIG. 1A is a plan view of a circuit device 10A and FIG. 1B is a cross-sectional view thereof.

With reference to FIG. 1A, the circuit device 10A of this embodiment includes: conductive patterns 11; circuit elements 12 electrically connected to the conductive patterns 11; and a sealing resin 13 covering the circuit elements 12 and the conductive patterns 11 while exposing back sides of the conductive patterns 11.

A material for the conductive patterns 11 is selected in consideration of adhesion, bonding and plating properties of a solder material. To be more specific, a conductive foil mainly made of Cu, a conductive foil mainly made of Al, a conductive foil made of alloy such as Fe—Ni, or the like is adopted as the material for the conductive patterns 11. Here, the conductive patterns 11 have a structure in which the patterns are buried in the sealing resin 13 while exposing the back sides of the patterns. The conductive patterns 11 are electrically separated by isolation trenches 41. As an example, land-shaped conductive patterns 11, on which the circuit elements 12 are mounted, are formed at four corners of the circuit device 10. Thereafter, conductive patterns 11 to be bonding pads of thin metal wirings 14 are formed therebetween. Moreover, on the back sides of the conductive patterns 11, which are exposed from the sealing resin 13, external electrodes 15 made of a solder material such as soft solder are provided. The conductive patterns 11 are formed by etching and side faces thereof are formed to be curved. Moreover, spots where no external electrode 15 is provided on a back of the device are covered with a resist 16.

As the circuit element 12, a semiconductor element such as a transistor, a diode and an IC chip or a passive element such as a chip capacitor and a chip resistor can be adopted. Moreover, a face-down semiconductor element, such as a CSP and a BGA, can be also mounted, although a thickness will be increased. Here, the circuit elements 12 mounted face up are electrically connected to the other conductive patterns 11 through the thin metal wirings 14.

The sealing resin 13 covers the circuit elements 12, the thin metal wirings 14 and the conductive patterns 11 while exposing the back sides of the conductive patterns 11. As the sealing resin 13, a thermosetting resin or a thermoplastic resin can be adopted. Moreover, the isolation trench 41 separating the respective conductive patterns 11 is filled with the sealing resin 13. Furthermore, the entire circuit device 10 of the embodiment of the present invention is supported by the sealing resin 13.

The isolation trench 41 is provided between the respective conductive patterns 11 and has a function of electrically separating the respective conductive patterns 11. Basically, a width W1 of the isolation trench 41 is formed to be uniform at any spot. The width W1 is, for example, about 150 μm. In other words, the respective conductive patterns 11 are equally spaced apart. Therefore, it is possible to equalize values of parasitic capacitances arising between the sealing resin 13 filled in the isolation trench 41 and the side faces of the conductive patterns 11. Moreover, since the parasitic capacitances are equalized, designing can be easily performed while taking into consideration the parasitic capacitances.

Note that, although it is described above that the width of the isolation trench 41 is uniform, this "uniform" indicates to be uniform including a difference. In a precise sense, a certain amount of error may occur. This error includes: an error occurring during the formation of an etching mask for etching; and an error occurring in wet etching. To be more specific, these errors are within a range of about several μm to several ten μm. Furthermore, the sealing resin 13 filled in the isolation trench 41 protrudes to the outside of the back sides of the conductive patterns 11.

Moreover, a back side of the sealing resin 13, on which the back sides of the conductive patterns 11 are exposed, is covered with the resist 16 made of resin. In openings provided in the resist 16, the external electrodes 15 made of the solder material such as soft solder are formed.

Figure 2:
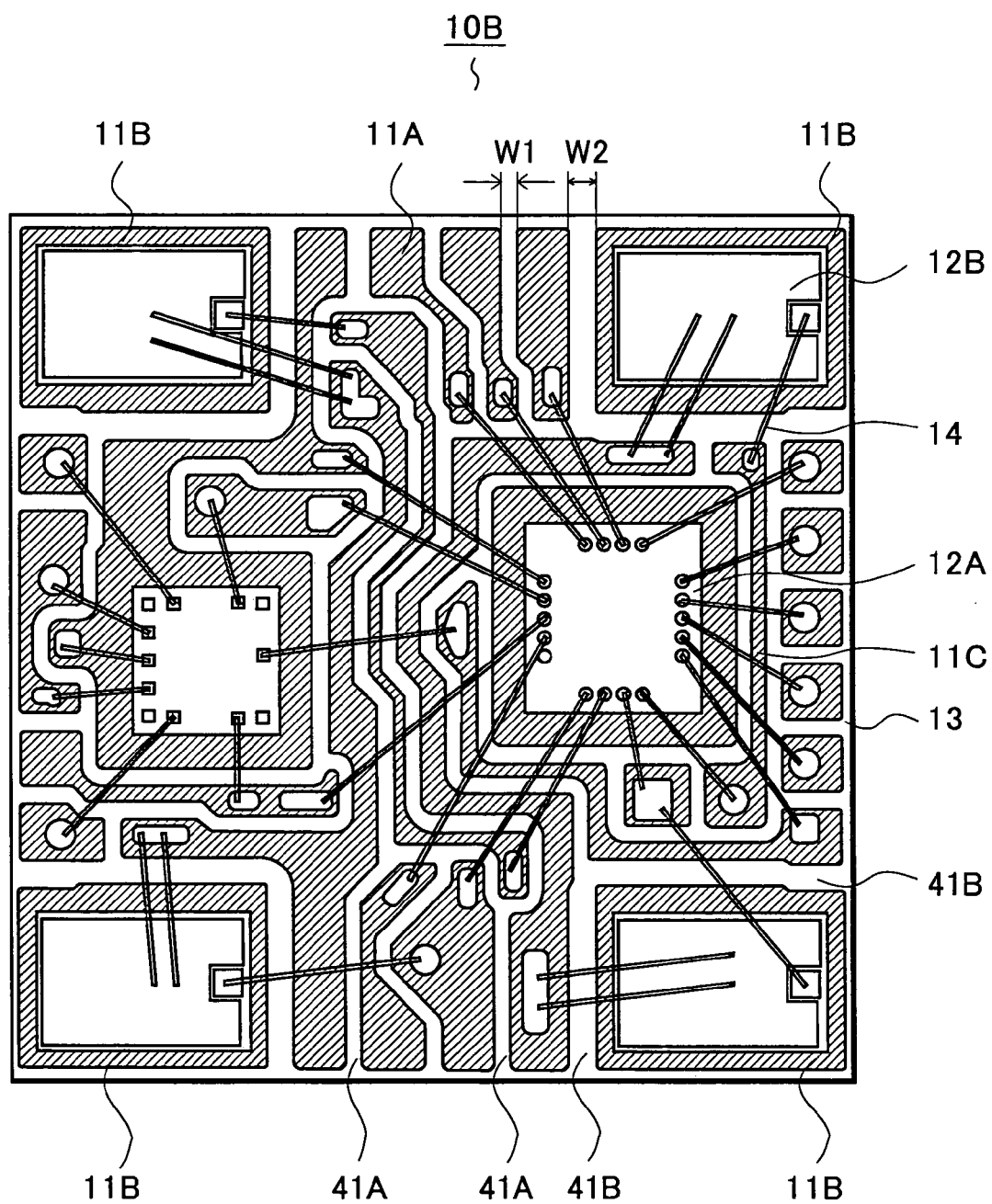
FIG. 2 is a plan view showing a circuit device according to an embodiment of the present invention.

With reference to FIG. 2, a circuit device 10B of another embodiment will be described. FIG. 2 is a plan view of the circuit device 10B. In the circuit device 10B shown in FIG. 2, a wiring part 11C is formed of a conductive pattern 11. Furthermore, distances between the conductive patterns 11 are locally different from one another in some portions. A configuration of the circuit device 10B other than those described above is the same as that of the circuit device 10A shown in FIGS. 1A and 1B.

The circuit device 10B has two kinds of circuit elements 12 built-in. One of them is a circuit element 12A that is an IC chip. The other one is a circuit element 12B that is a semiconductor element which performs switching of a large current of several amperes or more. The circuit element 12B is a semiconductor element which performs switching based on a control signal supplied from the circuit element 12A. Other than the semiconductor elements described above, other circuit elements such as a chip resistor and a chip capacitor may be built into the circuit device 10B.

The wiring part 11C is the conductive pattern 11 in which electrical connection regions are formed in planarly different spots. For example, in this wiring part 11C, one of its ends is connected to the circuit element 12A, that is the IC, through the thin metal wiring 14. Furthermore, the other end of the wiring part 11C is connected to the circuit device 12B, that is a switching element, through the thin metal wiring 14. Therefore, the wiring part 11C functions as a part of a path which connects the elements built into the circuit device 10B. Moreover, the wiring part 11C extends below the thin metal wirings 14. In the circuit device 10B of this embodiment, a plurality of the wiring parts 11C are formed. Furthermore, in places where the wiring parts 11C are adjacent to each other, distances between the wiring parts 11C are approximately the same.

In the circuit device described with reference to FIGS. 1A and 1B, the distances between the built-in conductive patterns 11 are approximately the same. However, in the circuit device 10B shown in FIG. 2, the distances are different in some spots. Specifically, a distance between a land-shaped die pad 11B, on which the circuit element 12B that is the switching element is disposed, and other conductive patterns 11A is longer than that in the other spots. Here, the other conductive patterns 11A include the conductive pattern 11 which forms the wiring part 11C and the land-shaped conductive pattern 11 on which the circuit element 12A that is a control IC is mounted. For example, a distance (W1) between each of the other neighboring conductive patterns 11A is about 150 μm. Meanwhile, a distance between the die pad 11B and each of the other neighboring conductive patterns 11A is about 250 μm.

As described above, the reason the die pad 11B is more distant from other conductive patterns 11 is to secure withstand voltage characteristics of the die pad 11B. On the die pad 11B, the circuit element 12B which performs high-current switching (for example, about 2 A at 250V) is die bonded by use of a conductive adhesive such as soft solder and a conductive paste. Therefore, when the circuit element 12B is in its ON operation, the high current described above also flows through the die pad 11B. Meanwhile, a small electric signal for control (for example, about several ten mA at several V) passes through the other conductive patterns 11A. Thus, since there is a large potential difference between the die pad 11B and the conductive patterns 11A, it is important to secure the withstand voltage characteristics by separating the both. According to this embodiment, it is possible to inhibit the high current passing through the die pad 11B from generating noise in the control signal passing through the conductive patterns 11A. Moreover, a conductive pattern connected to a source electrode or a drain electrode of the power system semiconductor element described above may be separated from the other conductive patterns. Consequently, the electric circuit built into the circuit device can be further stabilized.

To conclude, the width of the isolation trench 41 formed by etching is made substantially uniform in order to achieve a uniform depth of a first isolation trench. Thus, the uniform depth is achieved. Therefore, separation of the respective conductive patterns 11 by etching performed from the back side is performed well. However, in the case of the conductive patterns 11 through which the high current passes, it is required to separate the conductive patterns by a predetermined distance or more in order to secure the withstand voltage characteristics with the other conductive patterns 11. Accordingly, in terms of securing the withstand voltage, a width of a part of the isolation trench 41 is sometimes set to be wide. This width is indicated by W2 in FIG. 2.

The two kinds of pattern diagrams using the conductive foil have been described above. However, there are patterns other than those described above, which will be described below.

1: A pattern which is electrically connected to a discrete circuit element and the like and includes bonding pads disposed around a land having the circuit element die bonded thereon. This pattern is applied particularly to a circuit device including an IC with a small number of terminals or a discrete transistor.

2: A pattern which is electrically connected to a circuit element (for example, an IC) with a large number of pins and is routed around a land, on which the circuit element is disposed, for rerouting. A pattern extending continuously from pads electrically connected to the circuit element.

3: In a SIP (System in Package), a transistor, an IC, a passive element or an aggregate thereof is included. These circuit elements are electrically connected to each other through a wiring part 11C. As a shape of this wiring part 11C, besides the linearly extending shape as shown in FIG. 2, an L-shaped conductive pattern 11 may be adopted as the wiring part 11C.

With reference to FIGS. 3 to 10, a method for manufacturing the circuit device 10 will be described.

As shown in FIGS. 3A to 6B, in a first step according to the embodiment of the present invention, a conductive foil 40 is prepared and isolation trenches 41 are formed. Thus, convex conductive patterns 11 protruding upward are formed.

Figure 3A:
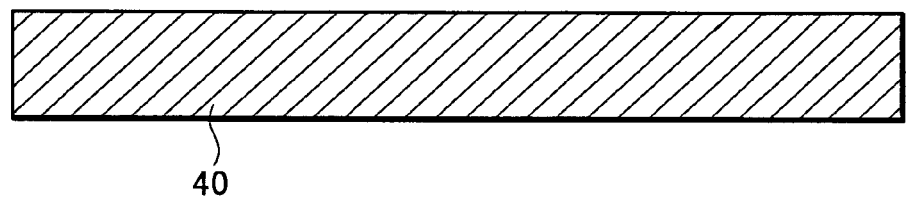
FIGS. 3A and 3B are a cross-sectional view (A) and a plan view (B) showing a method for manufacturing a circuit device according to an embodiment of the present invention.
Figure 3B:
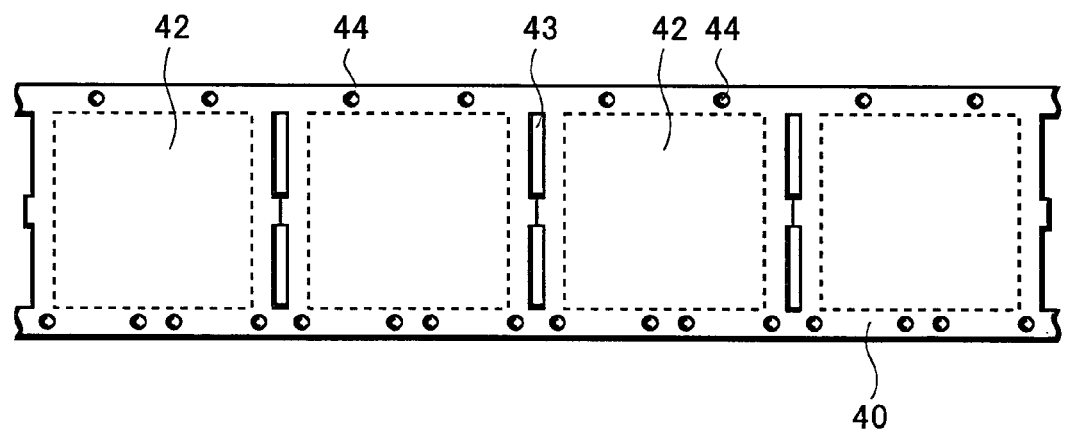

In this step, first, as shown in FIG. 3A, a sheet-like conductive foil 40 is prepared. A material for this conductive foil 40 is selected in consideration of adhesion, bonding and plating properties of a solder material. A conductive foil mainly made of Cu, a conductive foil mainly made of Al, a conductive foil made of alloy such as Fe—Ni, or the like is adopted as the specific material thereof. In consideration of etching to be performed later, a thickness of the conductive foil is preferably about 10 μm to 300 μm. Specifically, as shown in FIG. 3B, on the rectangular conductive foil 40, four or five of blocks 42, on which a number of units are formed, are arranged so as to be spaced apart. Between the respective blocks 42, slits 43 are provided, which absorb stress applied to the conductive foil 40 by heat treatment in a molding process and the like. Moreover, in upper and lower edges of the conductive foil 40, index holes 44 are provided at regular intervals and used for positioning in respective steps.

Figure 4:
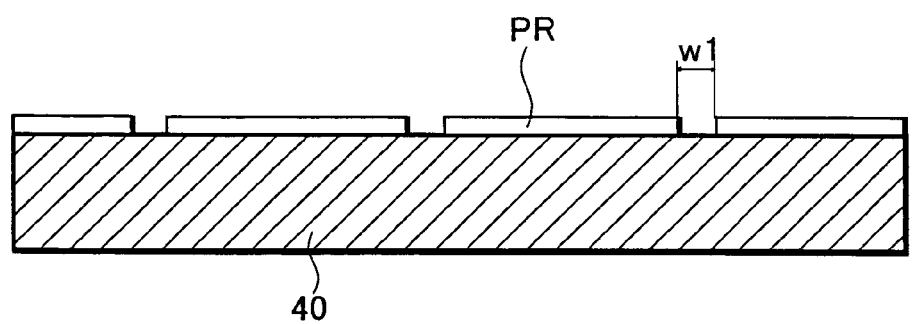
FIG. 4 is a cross-sectional view showing the circuit device according to an embodiment of the present invention.

Subsequently, a conductive pattern 11 for each of the blocks is formed. First, as shown in FIG. 4, a photoresist PR that is an etching-resistant mask is formed on the conductive foil 40 and the photoresist PR is patterned so as to expose the conductive foil 40 except for regions to be the conductive patterns 11. Thereafter, wet etching is performed by use of the resist PR as an etching mask. Thus, the conductive foil 40 exposed from the resist PR is etched and the isolation trenches 41 are formed. In order to form the equally-spaced isolation trenches 41, exposed portions in the resist PR are formed to have a uniform width W1. Here, since patterning of the resist PR is performed in exposure and development processes, a certain amount of error may occur.

Figure 5A:
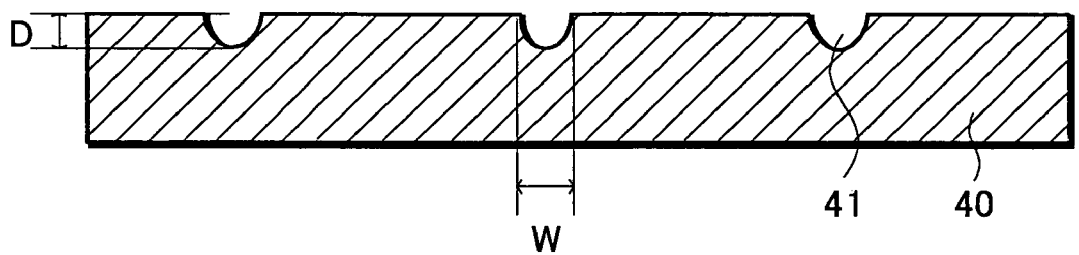
FIGS. 5A and 5B are a cross-sectional view (A) and a characteristic diagram (B) showing the circuit device according to an embodiment of the present invention.
Figure 5B:
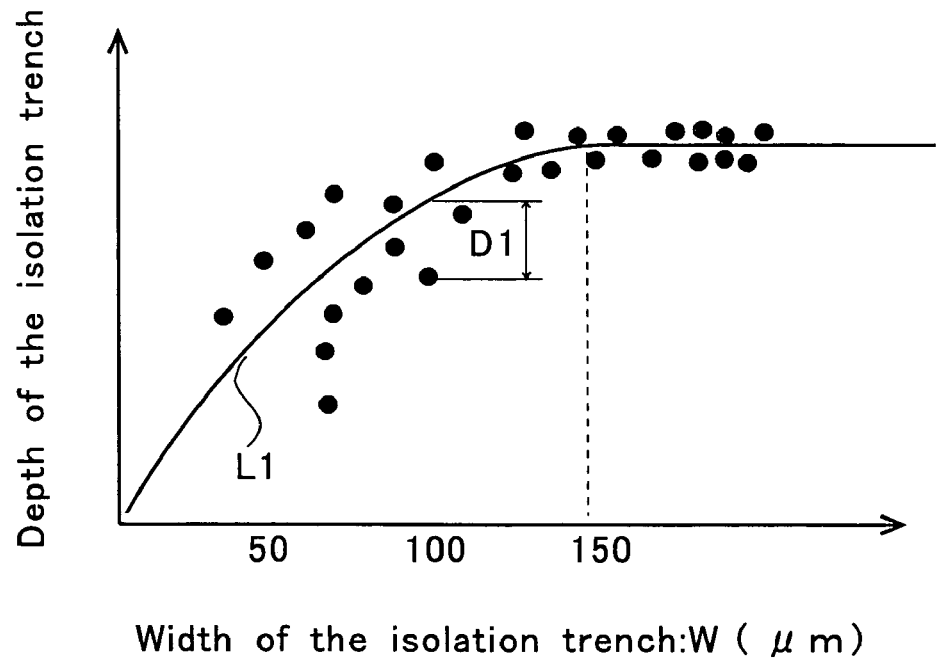

With reference to FIGS. 5A and 5B, description will be given of a relationship between a width W and a depth D of the isolation trench 41 formed by wet etching. FIG. 5A is a cross-sectional view of the isolation trench 41 formed by etching and FIG. 5B is a graph showing the relationship between the width and depth of the isolation trench.

With reference to FIG. 5A, description will be given of a cross section of the isolation trench 41 formed in the conductive foil 40. Here, the width of the isolation trench 41 is indicated by W and the depth thereof is indicated by D. The cross section of the isolation trench formed by wet etching is formed to be isotropic. Therefore, the depth D of the isolation trench 41 is controlled by the width W of the isolation trench and etching conditions. Specifically, the larger the width W of the isolation trench is, the larger the depth D thereof becomes. Furthermore, the more intensity of etching is increased, the more the depth D of the isolation trench is increased.

With reference to the graph of FIG. 5B, description will be given of the relationship between the width W and depth D of the isolation trench. The graph of FIG. 5B shows results obtained by forming a plurality of isolation trenches having different widths under the same wet etching conditions. In FIG. 5B, widths W and depths D of the respective isolation trenches are plotted in the graph. Moreover, an approximating curve L1, which is calculated from an aggregate of those points by use of a statistical method, is also drawn in the graph.

First, the approximating curve will be described. Within a range from 0 to 150 μm of the width of the isolation trench, the depth thereof is increased along with the increase in the width W of the isolation trench. When the width W of the isolation trench is 150 μm or more, the depth of the isolation trench stays constant. Specifically, this means that the depth of the isolation trench 41 having the width of 150 μm or more stays approximately constant.

Next, description will be given of a variation in values of the width and depth described above. It is assumed that a difference between a depth indicated by the approximating curve and a depth indicated by the point is D1. Accordingly, in a region where the depth of the isolation trench 41 is 0 to 150 μm, D1 is very large. This means that, when the isolation trenches 41 having the width of 150 μm or less are formed, there occurs a large variation in the depths of the respective isolation trenches 41. On the contrary, when the width W of the isolation trench 41 is 150 μm or more, the difference between the depth indicated by the approximating curve L1 and the depth indicated by the respective points becomes very small. Specifically, in the region described above, the difference between the depth indicated by the approximating curve and the depth indicated by the respective points is about several μm. Therefore, when the width W is set to 150 μm or more, the isolation trenches 41 with excellent uniformity can be formed.

Moreover, in the above description, the width WS at which the depth of the isolation trench 41 formed by etching stays constant is 150 μm or more. However, this width WS varies according to the etching conditions. Specifically, the width WS may differ between a method of showering an etchant on a surface of the conductive foil 40 and a method of dipping the conductive foil in the etchant. Moreover, it is anticipated that the width WS also varies according to the kind of the etchant used in etching of the conductive foil 40.

Figure 6A:
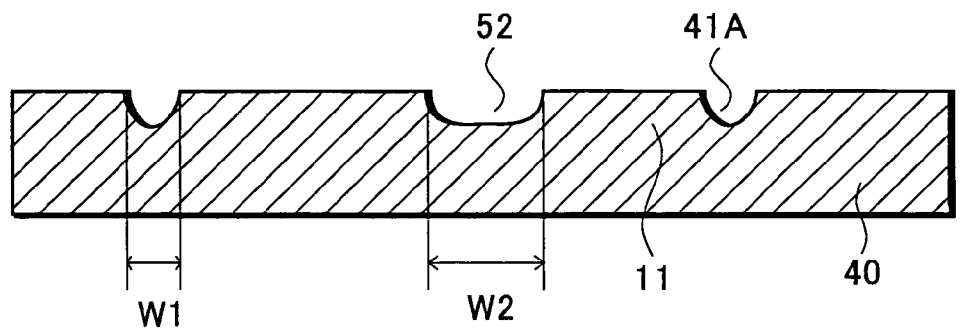
FIGS. 6A and 6B are a cross-sectional view (A) and a plan view (B) showing the method for manufacturing a circuit device according to an embodiment of the present invention.
Figure 6B:
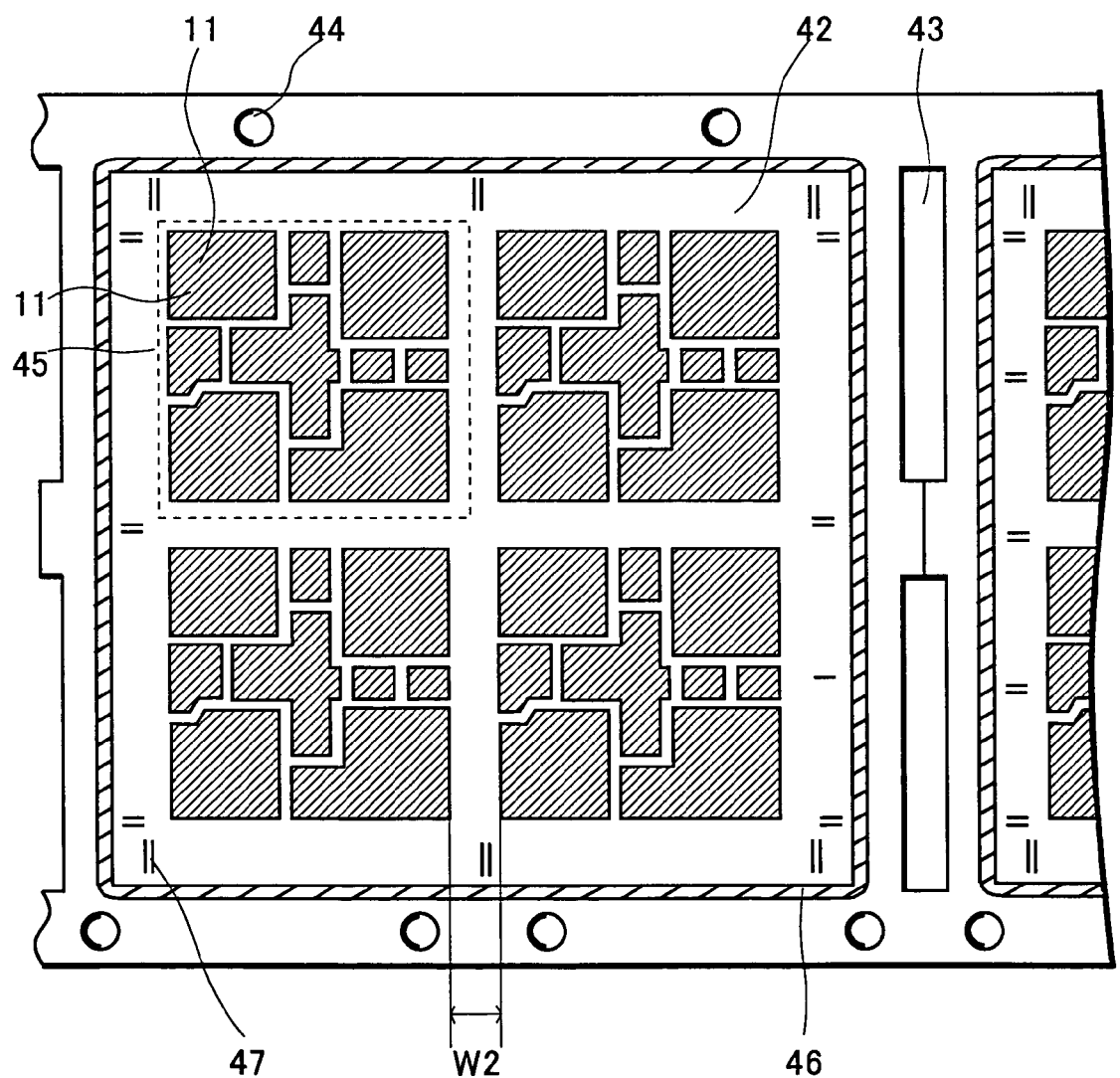

With reference to FIGS. 6A and 6B, description will be given of a specific shape of the conductive pattern 11 formed in the step described above. FIG. 6A is a cross-sectional view of the conductive foil 40 having the isolation trenches 41 formed therein and FIG. 6B is a plan view thereof.

With reference to FIG. 6A, the isolation trenches 41 are formed in the surface of the conductive foil 40. These isolation trenches 41 include a first and second isolation trenches 41A and 52. The first isolation trench 41A is an isolation trench for separating the conductive patterns 11 from each other in a unit. The second isolation trench 52 is an isolation trench for separating the units from each other and is formed to have a width larger than that of the first isolation trench 41A described above. This second isolation trench 52 and the first isolation trench 41A are filled with a sealing resin in a molding process to be performed later. By dicing the sealing resin filled in the second isolation trench 52, separation into respective circuit devices is performed. Here, the unit means a constituent component forming a circuit device.

To be more specific, the width W1 of the first isolation trench 41A can be set to about 150 μm. The width W2 of the second isolation trench 52 can be set to about twice the width W1 (300 μm). By setting the width W1 of the first isolation trench 41A to about 150 μm, the depth of each of the first isolation trenches 41A can be made uniform. Since this width of 150 μm is the minimum width capable of maintaining uniformity of the depth, the distance between the respective conductive patterns 11 can be minimized. Therefore, an effective area in the circuit device, which can be used as the conductive patterns 11, can be increased.

FIG. 6B shows specific conductive patterns 11. FIG. 6B corresponds to an enlarged view of one of the blocks 42 shown in FIG. 3B. A portion surrounded by a dotted line is a unit 45. In a block 42, a plurality of units 45 are arranged in a matrix form. In each of the units 45, the same conductive patterns 11 are provided. Although, here, four (2×2) of the units 45 are formed, a greater number of the units 45 can be also formed. Moreover, the second isolation trenches 52 described above are formed to have a grid shape between the respective units 45.

Figure 7A:
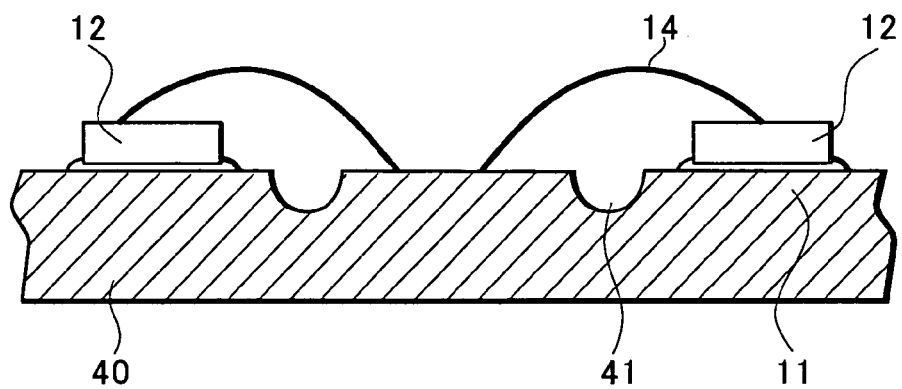
FIGS. 7A and 7B are a cross-sectional view (A) and a plan view (B) showing the method for manufacturing a circuit device according to an embodiment of the present invention.
Figure 7B:
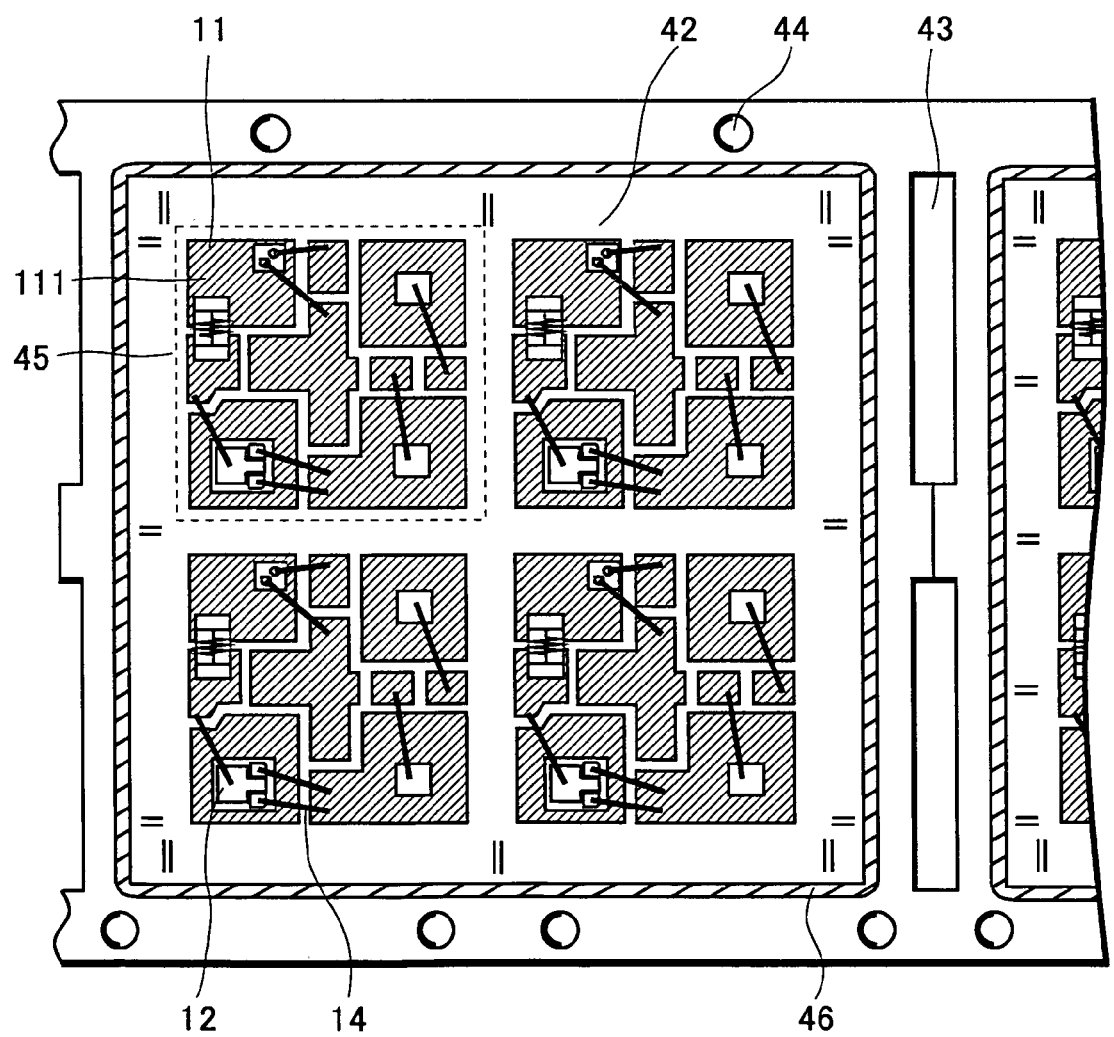

As shown in a cross-sectional view of FIG. 7A and a plan view of FIG. 7B, in a second step of the embodiment of the present invention, the circuit elements 12 are die bonded to the respective units 45 having desired conductive patterns 11 and connection means for electrically connecting electrodes of the circuit elements 12 in the respective units 45 to the desired conductive patterns 11 is formed.

As the circuit element 12, a semiconductor element such as a transistor, a diode and an IC chip or a passive element such as a chip capacitor and a chip resistor can be adopted. Moreover, a face-down semiconductor element, such as a CSP and a BGA, can be also mounted, although a thickness will be increased.

Figure 8:
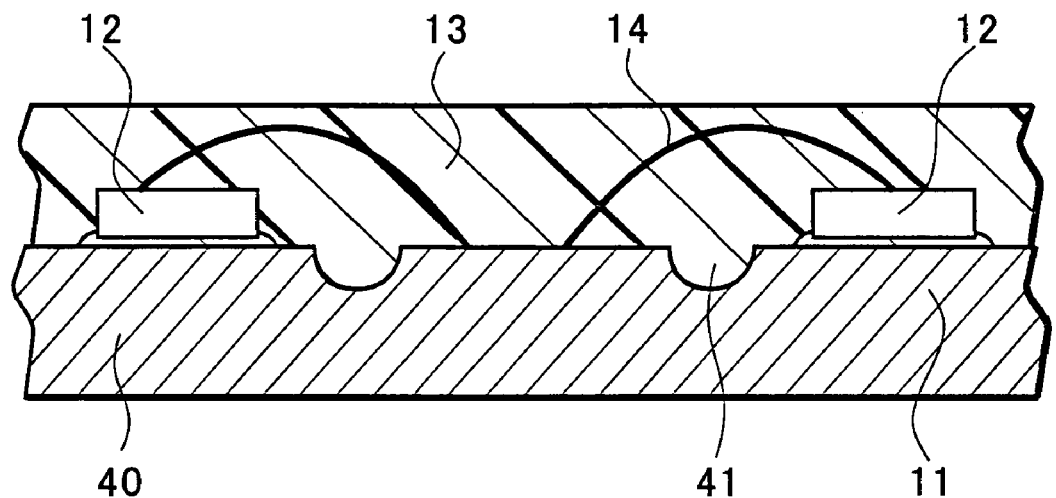
FIG. 8 is a cross-sectional view showing the method for manufacturing a circuit device according to an embodiment of the present invention.

As shown in FIG. 8, in a third step of the embodiment of the present invention, the sealing resin 13 is molded so as to entirely cover the circuit elements 12 in the respective units 45 and to be filled in the isolation trenches 41.

In this step, the sealing resin 13 covers the circuit elements 12 and the plurality of conductive patterns 11, and the isolation trenches 41 between the conductive patterns 11 are filled with the sealing resin 13. Moreover, the sealing resin 13 is fitted into curved structures on the side faces of the conductive patterns 11 and firmly bonded thereto. The conductive patterns 11 are supported by the sealing resin 13. Moreover, this step can be realized by transfer molding, injection molding or dipping. As a resin material, a thermosetting resin such as an epoxy resin can be realized by transfer molding and a thermoplastic resin such as a polyimide resin and polyphenylene sulfide can be realized by injection molding. Moreover, in this step, both of the first and the second isolation trenches 41A and 52 are filled with the sealing resin 13.

An advantage of this step is that the conductive foil 40 to be the conductive patterns 11 serves as a supporting board until the circuit elements 12 and the conductive patterns 11 are covered with the sealing resin 13. In a conventional method, a supporting board which is basically not required is adopted. In the embodiment of the present invention, the conductive foil 40 to be the supporting board is a material required as an electrode material. Thus, there is an advantage that works can be done with a minimum constituent material. Moreover, cost reduction can be also realized.

Figure 9:
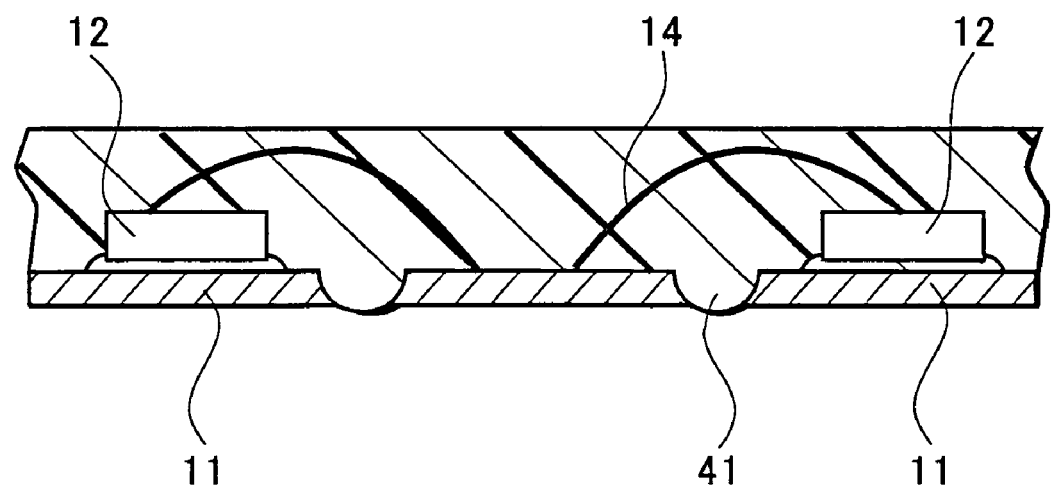
FIG. 9 is a cross-sectional view showing the method for manufacturing a circuit device according to an embodiment of the present invention.

As shown in FIG. 9, in a fourth step of the embodiment of the present invention, the respective conductive patterns 11 are electrically separated. Here, separation of the respective conductive patterns 11 is performed by removing the back side of the conductive foil 40 until the sealing resin 13 filled in the isolation trenches 41 is exposed. In this step, the back side of the conductive foil 40 is chemically and/or physically removed and the conductive foil 40 is separated as the conductive patterns 11. This step is performed by polishing, grinding, etching, metal evaporation by a laser or the like. Particularly, when the conductive foil 40 is removed by etching, a structure in which the sealing resin filled in the isolation trenches 41 protrudes downward is obtained.

As shown in FIG. 6A, the depth of the second isolation trench 52 formed to have the large width is approximately equal to the depth of the first isolation trench 41A. Therefore, if the foregoing removal of the conductive foil 40 is performed by wet etching, the sealing resin filled in the second isolation trench 52 and the first isolation trench 41A protrudes downward to the same extent.

Furthermore, the back sides of the conductive patterns 11 are processed to obtain a final structure shown in FIGS. 1A and 1B. Specifically, back electrodes 15 are formed by depositing a conductive material such as soft solder on the exposed conductive patterns 11 according to need. Thus, the circuit device is completed.

Figure 10:
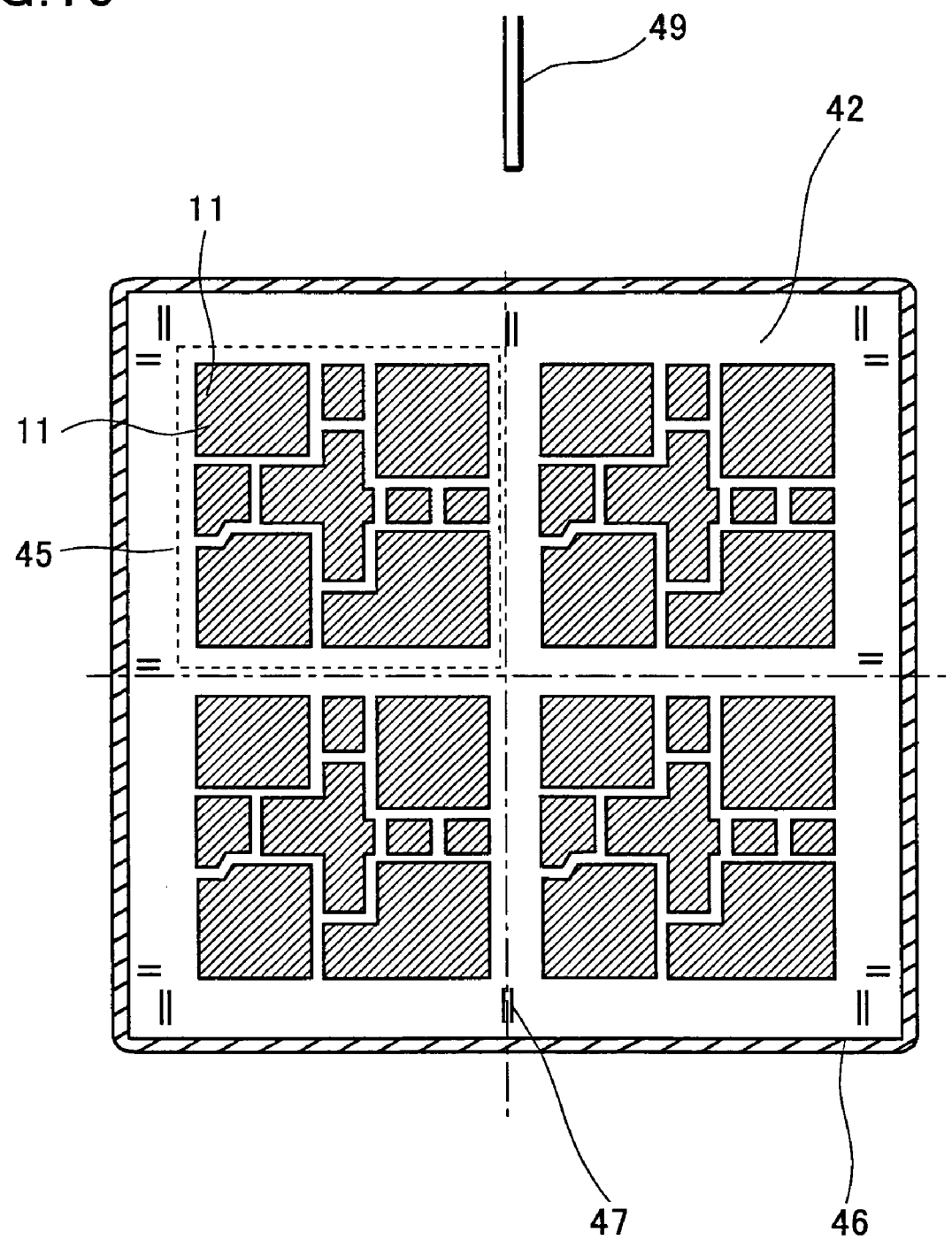
FIG. 10 is a plan view showing the method for manufacturing a circuit device according to an embodiment of the present invention.
Figure 11:
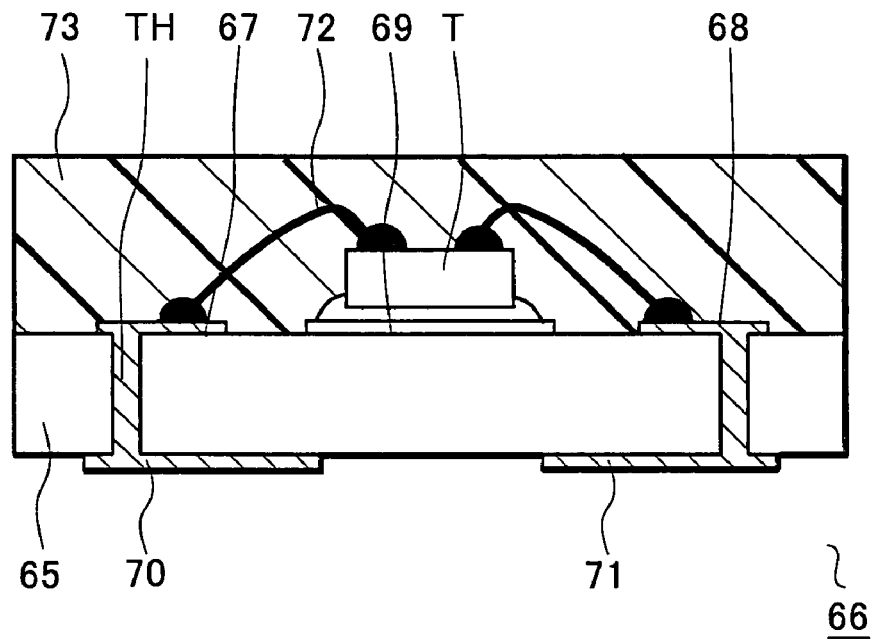
FIG. 11 is a cross-sectional view showing a conventional circuit device.
Figure 12:
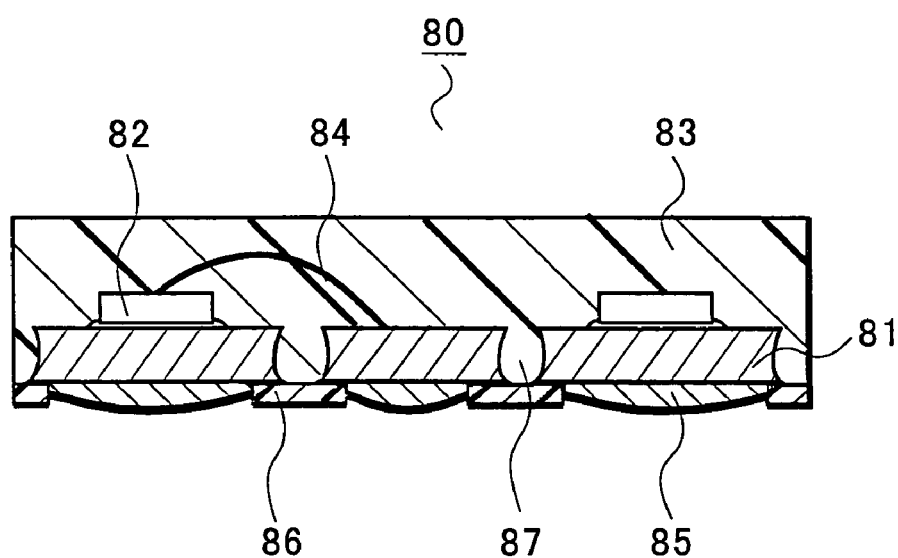
FIG. 12 is a cross-sectional view showing a conventional circuit device.

As shown in FIG. 10, in a fifth step of the embodiment of the present invention, the sealing resin 13 is separated for each of the units 45 by dicing.

In this step, the sealing resin 13 is diced by use of a blade 49 along dicing lines between the respective units 45 and is divided into separate circuit devices. In this step, since only the sealing resin 13 filled in the isolation trenches exists in the dicing lines, there is a little wearing of the blade 49. Furthermore, the sealing resin can be diced into pieces with an extremely accurate shape without occurrence of metal burrs. To be more specific, the dicing described above is performed along intermediate portions of the second isolation trenches 52 formed between the respective units 45.

A thickness of the blade 49 used for the dicing described above is, for example, about 100 μm. Therefore, by forming the second isolation trenches 52, in which the dicing is performed, to have a large width, it is possible to prevent the blade 49 from touching the conductive patterns 11.

What is claimed is:

1. A circuit device having top, side, and bottom surfaces, the circuit device comprising:
   conductive patterns separated by isolation trenches, each conductive pattern comprising a respective upper surface facing the top surface of the circuit device and a respective lower surface facing the bottom surface of the circuit device;
   circuit elements comprising terminals electrically connected to the conductive patterns; and
   a sealing resin covering the conductive patterns, the circuit elements, the upper surface and the side surfaces and not covering back sides of the conductive patterns, wherein the sealing resin disposed in the isolation trenches projects downward from the lower surface of the conductive patterns;
   wherein the conductive patterns are equally separated by the isolation trenches and wherein the circuit device is hexahedral and all surfaces except for the bottom surface comprise the sealing resin.

2. The circuit device according to claim 1, wherein a distance between the conductive patterns is greater than 150 μm.

3. The circuit device according to claim 1, wherein the isolation trenches are formed to have a uniform depth.

4. The circuit device according to claim 1, wherein all the conductive patterns are equally spaced apart.

5. The circuit device according to claim 1, wherein the conductive patterns include a die pad on which a semiconductor element is die bonded and a distance between the die pad and each of the other neighboring conductive patterns is longer than a distance between each of the other conductive patterns.

6. The circuit device according to claim 5, wherein the semiconductor element is a power system semiconductor element.

7. A circuit device having top, side, and bottom surfaces, the circuit device comprising:
   conductive patterns isolated from each other by isolation trenches formed by etching;
   circuit elements comprising terminals electrically connected to the conductive patterns; and
   a sealing resin covering the conductive patterns, the circuit elements, the upper surface, and the side surfaces and not covering back sides of the conductive patterns;
   wherein the depth of the isolation trench is substantially uniform and wherein the circuit device is hexagonal and all surfaces except for the bottom surface comprising the sealing resin; and wherein each conductive pattern comprises a respective upper surface facing the top surface of the circuit device and a respective lower surface facing the bottom surface of the circuit device and further wherein the sealing resin disposed in the isolation trenches projects downward from the lower surface of the conductive patterns.

8. The circuit device according to claim 7, wherein the width of the isolation trench is made to be not less than 150 μm.

9. The circuit device according to claim 7, wherein the isolation trenches are formed to have equal widths.

10. The circuit device according to one of claims 1 and 7 comprising thin metallic wire coupled between the terminals and the conductive patterns.

11. The circuit device according to one of claims 1 and 7 wherein the conductive patterns comprise die pads to implement the circuit elements and bonding pads connected to the terminals through thin metallic wire.

12. The circuit device according to claim 1 wherein the shortest distance between each pair of adjacent conductive patterns is substantially constant.

13. The circuit device according to claim 7 wherein the shortest distance between each pair of adjacent conductive patterns is substantially constant.

* * * * *